United States Patent [19]
Boyd

[11] 3,959,667

[45] May 25, 1976

[54] OVERCURRENT TRIP DEVICE

[75] Inventor: Donald R. Boyd, Waukesha, Wis.

[73] Assignee: Allis-Chalmers Corporation, Milwaukee, Wis.

[22] Filed: Mar. 7, 1974

[21] Appl. No.: 449,194

Related U.S. Application Data

[62] Division of Ser. No. 316,372, Dec. 18, 1972, Pat. No. 3,831,061.

[52] U.S. Cl. .......................... 307/235 T; 307/238; 328/151
[51] Int. Cl.² ........................................... H03K 5/20
[58] Field of Search ...................... 307/235 R, 238; 328/150, 151

[56] References Cited
UNITED STATES PATENTS

| | | | |
|---|---|---|---|
| 3,454,787 | 7/1969 | Gelernter | 307/235 R |
| 3,460,000 | 8/1969 | Kiffmeyer | 307/235 X |
| 3,743,950 | 7/1973 | Sellari, Jr. et al. | 307/235 R |
| 3,749,944 | 7/1973 | Luebrecht | 307/235 R |

*Primary Examiner*—John Zazworsky
*Attorney, Agent, or Firm*—Robert C. Jones

[57] ABSTRACT

A signal voltage level sensing circuit particularly well adapted for use in a static overcurrent trip device. An operational amplifier is utilized to sense the difference between a signal voltage and a predetermined reference voltage while another operational amplifier is the memory element. Minimum duration of input signal to which the memory element responds is established by a resistor and a capacitor in conjunction with the threshhold of the memory element.

1 Claim, 4 Drawing Figures

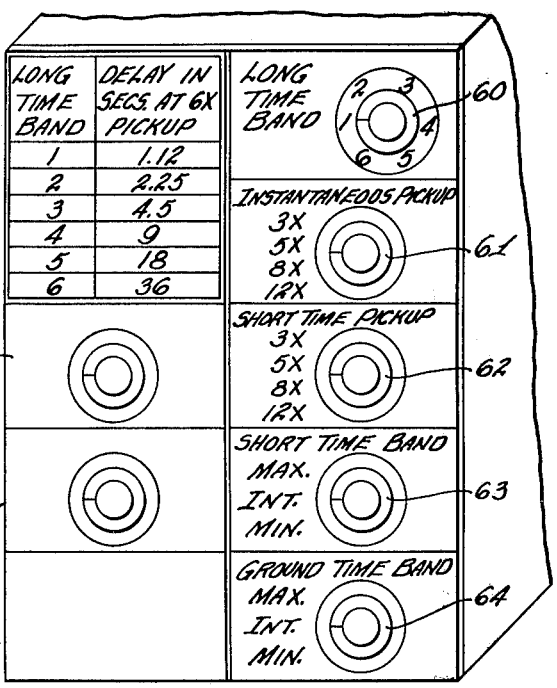
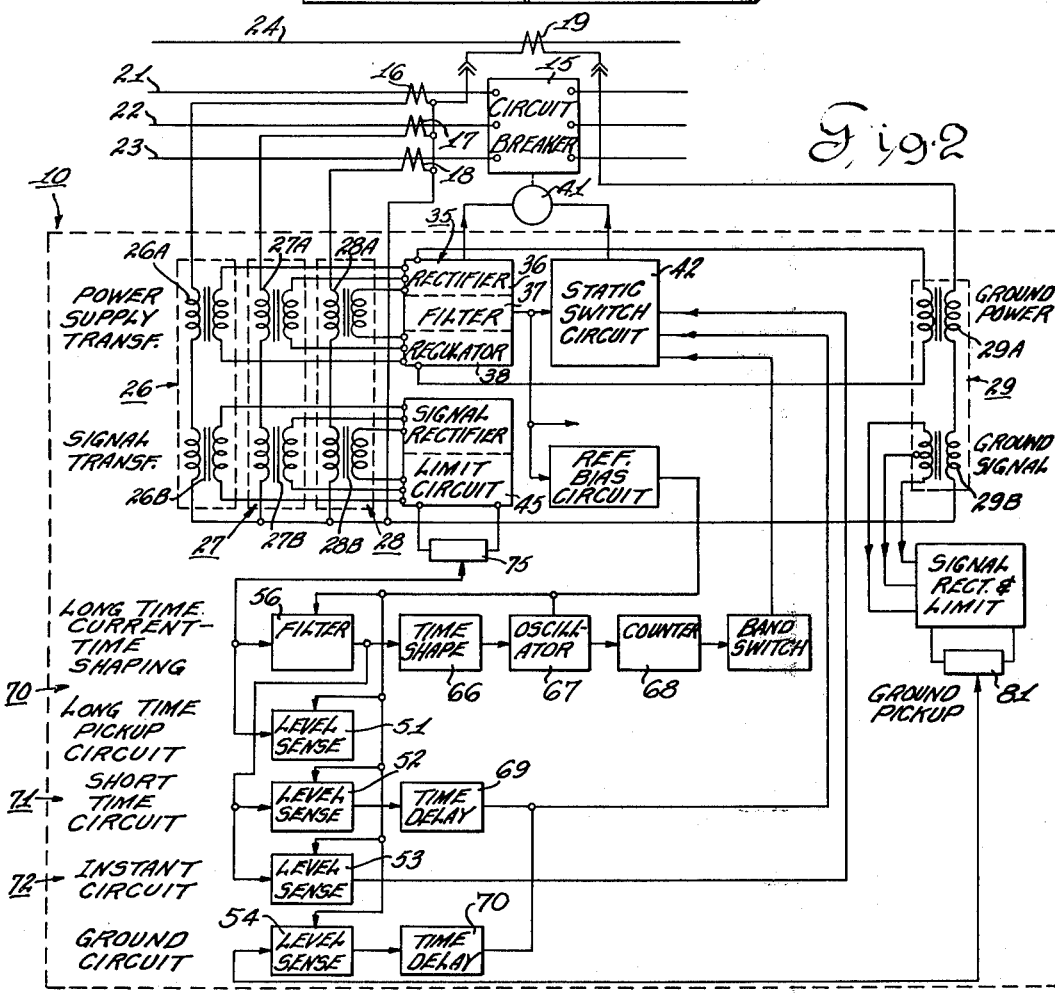

OVERCURRENT TRIP DEVICE

The present application is a division of application Ser. No. 316,372, filed Dec. 18, 1972, now U.S. Pat. No. 3,831,061, issued Aug. 20, 1974.

SUMMARY OF THE INVENTION

This invention relates to a signal voltage level sensing circuit particularly suitable for use in a static overcurrent trip device for sensing live and/or ground faults.

It is desirable to employ a fully static overcurrent tripping device which incorporates and utilizes static devices in a level sensing circuit which operates to sense the level of the signal by which the device starts its timing function. The provision of an inverse time shaping circuit utilizing static devices as well as an oscillator circuit which also uses static devices and the inclusion of a memory and band switching circuit likewise utilizing static devices all cooperate to provide a reliable and extremely sensitive overcurrent sensing and tripping device.

Accordingly, it is an object of the present invention to provide an improved static overcurrent tripping device which is relatively small and compact, rugged in construction and which mounts on the circuit breaker without any undue modification of the circuit breaker itself.

Still another object of the present invention is to provide a static overcurrent tripping device which requires no secondary source of power and which derives both an intelligence signal and power for operation from an overcurrent flowing through the circuit breaker with which it is associated.

Another object of the present invention is to provide a device of the aforesaid character which has an improved level sensing circuit comprised of static devices.

A further object of the present invention is to provide a device of the aforesaid character which includes a static device memory and band switching circuit.

A still further object of the present invention is to provide a device of the aforesaid character which has a more ideal timing characteristic in which, for example, the time for tripping varies inversely as the square of the overcurrent or can be set to vary by some other predetermined relationship.

Other objects and advantages of the invention will hereinafter appear.

DESCRIPTION OF THE FIGURES

FIG. 1 is a front view of a static trip device showing the selective controls thereof;

FIG. 2 is a functional block diagram of the static trip device;

DESCRIPTION OF THE PREFERRED EMBODIMENT

Figure 3:
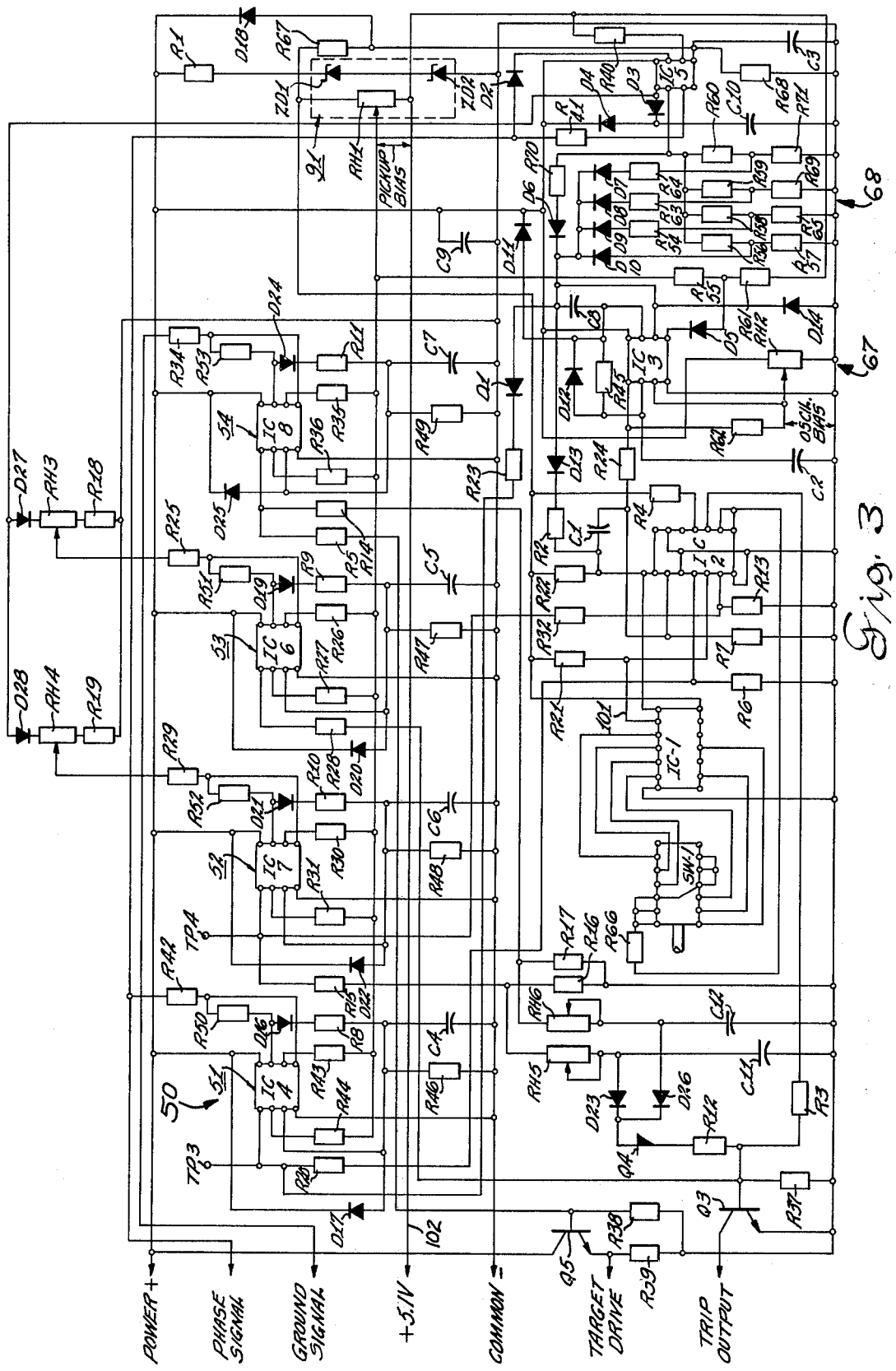
FIG. 3 is a schematic diagram of the logic module of the static trip device.

As previously mentioned, FIG. 1 is a block diagram of the basic static overcurrent tripping functions as well as the short time, instantaneous, and ground fault functions of the static trip device 10 in which the present invention is incorporated. The device 10 is contained in an enclosure 11 which mounts on a circuit breaker 15, depicted in FIG. 2. As shown in FIG. 2, current sensing transformers 16, 17 and 18 and a neutral current sensing transformer 19 are provided in which the secondary windings are inductively coupled with phase buses 21, 22 and 23 and with a neutral bus 24. These current transformers are mounted on the primary studs of the circuit breaker 15. The current transformers supply a signal to the static trip device 10 which is proportional to the current in the primary circuit. This signal passes to transformers 26, 27, 28 and 29 which are each a pair of serially connected transformers. Each of the transformers 26, 27, 28 and 29 comprise a power transformer 26A, 27A, 28A and 29A respectively, and a signal transformer 26B, 27B, 28B and 29B, respectively, which are serially connected to their associated power transformers. The power transformers 26A, 27A, 28A and 29A are designed to saturate to help limit the power supply output. Power supplied from the power transformers 26A, 27A, 28A and 29A pass through a power supply means 35 comprising a rectifier circuit 36, filter circuit 37 and regulating circuit 38 to establish the self-contained regulating power supply for operating the static trip device 10 and for tripping the circuit breaker 15. From the power supply means 35 power is supplied to a tripping coil 41 of the circuit breaker 15 through a static switch circuit 42.

Signals from the signal transformers 26B, 27B and 28B are transmitted to a signal rectifying circuit means 45 where they are combined into a single D.C. signal which is the input for two circuits. This single D.C. signal is applied to a voltage divider RH-1, schematically depicted in FIG. 3, for setting the amount of signal that is supplied to a logic circuit 50. The logic circuit signal is supplied to long time sensing or monitoring circuit 51 and compared to a standard preset value. If the signal is below the preset standard value the trip device 10 will remain inactive, but continues to monitor the D.C. signal. However, if the D.C. signal exceeds the preset standard value the selected level sensing circuit is immediately turned "on."

The logic circuit input signal is also applied to an active filter circuit 56 which filters and holds the D.C. signal at peak value. The input signal which is supplied to the active filter circuit is also directed through the amplifier of the active filter 56, to a short time sensing circuit 52 and an instantaneous sensing circuit 53.

To this end the D.C. signal, depending upon its magnitude and the setting of the preselected adjustments, established through controls 61, 62, 63 and 65, FIG. 1, will automatically activate one of the sensing circuits 51, 52, 53. If the magnitude of the D.C. signal is relatively low, the long time sensing circuit 51 will be activated. On the other hand, if the magnitude of the D.C. signal is relatively high, either the short time sensing circuit 52 or the instantaneous sensing circuit 53 will be activated.

As depicted, the short time sensing circuit 52 does not require a time shaping circuit because it has constant time relationship characteristics. On the other hand, the long time sensing circuit 51 requires a time shaping circuit 66 which determines the shape and the slope of the time-current relationship. Thus, if the long time sensing circuit 51 is activated, the D.C. signal from the signal rectifier and filter circuits 36 and 37 is transmitted to the time shaping circuit 66. The output from the time shaping circuit 66 is applied as an input to an oscillator circuit 67, the frequency of which depends upon the magnitude of input signal. The oscillator circuit output is counted and stored in a counter circuit 68 and at a selected count an output is obtained and transmitted to the static switching circuit 42 to energize the coil 41 of the circuit breaker 14 to open the breaker. When the circuit breaker 15 opens, the signal to the coil 41 disappears and the static trip device 10 automatically resets itself for a subsequent operation.

A similar condition obtains for the instantaneous and short time circuits 71 and 72 respectively, and they will be activated through their signal level sensing circuits 53 and 52, respectively. As shown in FIG. 2, the signal from the level sensing circuit 52 is transmitted to a short-time or delay circuit 69 and it must complete its function to transmit a signal to reactivate or turn "on" the static switch circuit 42. When the circuit breaker 15 opens, the signal to the coil disappears and the static trip device 10 automatically resets itself. A similar condition obtains for the instantaneous and the short time circuits and they will be activated through their signal level sensing circuits. A short-time timing or delay circuit 52 associated with the level sensing circuit 51 must complete its function to transmit a signal to activate or turn "on" the static switch circuit 42. In either case, the static switch circuit 42 will be activated only upon completion of a timing function except for the instantaneous function which will operate immediately.

As shown in FIG. 2 the power supply 35 is combined in a modular form with the static switch circuit 42 and the signal rectifying and limit circuit 45 which are readily adaptable to module arrangement. This particular module also includes a long time pickup control 75. As previously mentioned, the three phase input circuits which are identical and made up of the power transformers 26A, 27A and 28A and the ground input transformer 29A are designed to saturate to help limit the power supply output. Each of the transformers 26A, 27A, 28A and 29A supplies power to associated full wave rectifiers, (not shown). For a more detailed description of the full wave rectifiers reference may be had to U.S. Pat. No. 3,831,061. The outputs of each of the rectifiers are connected in parallel to supply power to an RC filter 81 a regulator (not shown). The RC filter 81 operates to filter the pulses of current supplied by the rectifiers (not shown) into a smooth D.C. voltage. This voltage is regulated by the regulator to some value, for example, 24 volts. The regulator comprises a Zener diode, a transistor and the additional two sections of the previously mentioned resistor. By regulating the supply voltage in the manner described above, a higher sink current capability is provided and better stability for the power supply voltage is obtained. The Zener diode operates at nearly constant current which is relatively low so that self heating is minimized. Under high current, the regulator transistor turns more fully "on" limiting its internal dissipation. The energy is dissipated as heat in the resistance sections of the resistor. As herein depicted the regulator transistor is a Darlington device to provide very high gain so that a small Zener diode can be utilized. As an example, at 6 amperes sink current, a 24 volt Zener diode has an internal dissipation of 144 watts, while the regulator transistor is turned on around 1 volt drop and about 6 watts internal dissipation. The provision of another resistor in the circuit provides for a slightly higher current through the Zener diode before conduction starts in regulator transistor. In this manner assurance is obtained that the Zener diode is operating at near its proper current. For a more detailed description of the above mentioned circuits for the outputs of the rectifiers reference may be had to U.S. Pat. No. 3,831,061.

The transformers 26B, 27B and 28B are each precision wound, toroidal transformers and are each utilized in combination with four diodes in a full wave bridge rectifier and a precision power resistor to form subassemblies which convert the phase current signal into a voltage that is used for the signal input for the device.

The signal inputs from the subassemblies are fed to three associated diodes. The forward voltage drops of the associated diodes are matched at approximately the current flowing when the device picks-up. This is done so that pick-up occurs at the same current for each of the three phases. Another diode is also provided and is matched to the aforementioned three diodes and provides an offset voltage to cancel the forward drop of these three diodes. However, the matched diode tends to operate at a slightly higher current level than the three associated diodes so that its voltage drop is higher than the three associated diodes at pick-up. To account for this difference, a resistor is provided to increase the current through the associated diodes to provide compensation. The signal obtained from any one of the subassemblies will limit the signal voltage at the slider of the potentiometer RH-1 to that of the supply voltage. For a detailed description of the limiting circuits reference may be had to U.S. Pat. No. 3,831,061. This signal will be supplied to the logic circuit 50, shown in FIG. 3, and will be limited to the positive supply voltage.

A pair of resistors are connected on either side of the potentiometer RH-1 operate to set the adjustment limits for the long time pick-up control 75. A current limit diode is provided and operates to provide a low impedance source to support a reference bias circuit 91 of the logic circuit 50 which, for the purpose of this illustration, is assumed to be 5.1 volts. The voltage applied to the current limiting diode will cause a Zener ZD-2, shown in FIG. 3, which, for purposes of illustration, is assumed to be a 5.1 volt Zener, to regulate even when the total supply voltage is down to around 8 volts.

To prevent the output of the regulator transistor of the static switch circuit 42 from discharging the storage capacitor C9, shown in FIG. 3, and thereby confusing the logic circuit 50 before the breaker 15 has time to trip out, a diode, is provided.

Due to the inductive nature of the magnetic trip release device 51, transient voltages may be generated and must be suppressed. To this end, a diode D19, FIG. 3, is provided and operates to provide the necessary voltage suppression for these transients.

The ground power transformer 29A is similar to the transformers 26A, 28A and 28A, except it has more turns to provide power at lower input current. A ground sensing transformer 29B is similar to the phase sensing transformers 26B, 27B and 28B, except that it is much smaller. Since the ground current is sensed for pick-up only and linearity over several times pick-up current is not required, the transformer 29B can be made quite small. The output from the ground signal transformer 29B is rectified by 2 diodes in a center-tapped, full wave configuration. This signal is supplied to a ground pick-up control potentiometer. The maximum ground signal is limited to about twice pick-up voltage by a pair of diodes which are connected in series. U.S. Pat. No. 3,831,061 may be referred to for a more detailed description of the ground circuit.

In FIG. 1, the overcurrent trip device 10 is shown with the associated selectively adjustable controls. A long time band control 60 is a small switch that selects the long time curve that the overcurrent trip device 10 will operate on. As instantaneous pick-up control 61 operates to control the level sensor circuit 53 associated with the instantaneous circuit 72. A short time pick-up control 62 is adjustable to select the current level that activates the short time delay circuit 69. The setting of a short time band control 63 determines the time delay between short time pick-up and breaker tripping. A ground time band control 64 controls the time delay 70 between ground pick-up 83 and the breaker tripping.

In FIG. 3, the schematic diagram therein shown of the logic module 50 includes the level sensing circuits 51, 52, 53 and 54 and the timing circuits with their associated controls. The logic circuitry makes use of three types of integrated circuits. IC-1 is a complementary metal-oxide silicon counter circuit. The internal circuit is a seven stage, ripple-carry binary counter in which seven flip-flop circuits are connected in series so that the output of one stage drives the input of the next providing a divide by two action for each succeeding stage. A common reset line 101 for all the outputs is included in the circuit. The output of the IC-1 counter which is desired is established by manipulating the long time band control 60 of the selector switch SW-1. Since, as shown in FIG. 3, only the six positions of the selector switch SW-1 are being utilized, the first position thereof is being used to select the second output of the IC-1 counter which establishes a two pulse output from the oscillator IC-3 or the second position which establishes a four pulse output with the last position, or the sixth position establishing a 64 pulse output.

The second type of integrated circuit is a monolithic array of five transistors, all of which are essentially isolated low voltage, low current transistors; the integrated circuit IC-2 exemplifies such an array. One of the transistors of the IC-2 array is utilized for shaping the clock pulse from the oscillator and completes the oscillator circuit 67. Another of the transistors of the IC-2 array inverts the output of the long time level sensing circuit 51 to provide the correct polarity to the counter reset line 101. Still another of the transistors of the IC-2 array is utilized for clamping out the long time trip signal if the short time circuit 71 is activated; and another of the transistor of the IC-2 array is utilized as a current amplifier for the output of the IC-1 counter 68.

A third integrated circuit used in the device is exemplified by IC-3 and is a dual, internally compensated operational amplifier. This type of integrated circuit is used for level sensing or signal detection, the oscillator 67 and the filter and startup circuit.

Four operational amplifiers are used for signal level sensing in the sensing circuits 51, 52, 53 and 54; these are integrated circuits IC-4, IC-6, IC-7 and IC-8. The circuit for each of these four operational amplifiers which are utilized for signal level sensing are identical except for the positive feed back resistor. Thus, in FIG. 4 the operational amplifier IC-4 is shown in detail to show the separate components thereof. The two input pins are labeled plus and minus for clarity of illustration. If the minus input is more positive than the plug input, the output will go negative. On the other hand, if the plus input is more positive, the output will go positive. It should be noted at this time that the amount of differential signal voltage required is very small and, thus, the signal level sensing is very sensitive and responds extremely fast. The amplifier has a typical gain of 200,000 and when used as a level senser, the amplifier labeled "A" is the actual level sensing portion and the amplifier "B" is a memory element thereof. For example, if both the signal and the reference bias are set above the 5.1 volt line 102 and the reference bias is preset to be 500 millivolts and there is no signal input to pin 5 of the "A" amplifier of the logic level sensing circuit, pin 6 thereof is 500 millivolts more positive than pin 5, so that the output of amplifier "A" is at or near the negative supply line voltage. When the signal rises to 500 millivolts or slightly above, pin 5 of the "A" amplifier becomes positive with respect to pin 6 and the output of amplifier "A" becomes positive. This output voltage causes current flow through resistor R8 and the diode D16 to charge capacitor C4. Voltage on capacitor C4 is applied to the plus input of the amplifier "B" and when this voltage exceeds 5.1 volts plus the reference bias, amplifier "B" turns on and its output rises to nearly that of the positive supply voltage. The value selected for resistor R8 and capacitor C4 and the threshold of operational amplifier "B" provides a means for controlling the minimum duration of input signal to which the memory element responds.

The input signal voltage to the level sensing circuit 51 is a rectified sine wave rather than a D.C. signal, so the pick-up of the circuit may occur at the peak of the wave shape. Thus resistor R50 in conjunction with the resistor R42 and the source resistance provide a positive feedback to hold the "A" amplifier on for a period of time after the peak of the signal wave is passed. This arrangement widens the pulse of voltage applied to the resistor R8 allowing capacitor C4 to more fully charge, providing a snap action "turn-on" for the level sensor. Since the long time and short time circuit functions from the full wave rectified three phase signals, the amount of positive feedback allowable is small. If the feedback is too great, the drop out, after the device has picked-up and the current is reduced, is unsatisfactory. The instantaneous and ground signals are operable faster in the case of instantaneous, or single phase in the case of ground, so that a larger amount of positive feedback is desirable.

Capacitor C4 and resistor R46 provide a time delay or memory so that the amplifier "B" of the level sensing circuit stays on from one-half cycle to the next. The diode D16 in the circuit prevents the "A" amplifier from discharging the capacitor C4, while the resistor R8 provides some slight delay of pick-up to help suppress operation which could occur from noise. Resistor R42 is part of the feedback circuit, with resistor R43 matching the input impedance for the two sides of amplifier "A", and resistor R44 is utilized for current limiting. The diode D17 prevents the voltage on capacitor C4 from exceeding the positive power supply by an excessive amount when the device trips the breaker 15 which will result in the supply voltage collapsing.

In the oscillator circuit of the integrated IC-3, previously mentioned, the "A" amplifier thereof is used as an inverting integrator circuit. Until the long time level sensing circuit releases the oscillator, the minus input pin is held negative so that the output of the "A" amplifier is held at a positive supply voltage. When the long time circuit picks up, it releases minus input and allows the integrator to come under the control of the input current. The current flow into the minus input tends to drive the amplifier output in a negative direction. This causes a current flow into capacitor C8. The higher the current flow into the junction, the faster the output changes and the higher the charging current is for capacitor C8. If the "A" amplifier bias current is small enough to be neglected and the gain of the "A" amplifier is high enough, all the current flow into the input flows into capacitor C8. This condition is an ideal case and is only approached in actual circuitry. It should be noted that the voltage for the input to the "A" amplifier stays at the same level and is determined by the resistor R55, the resistor R61 and the diode D5 bias circuit. The change in the output of the integrator through capacitor C8 holds the other input terminal at the same level of voltage.

The output of the "A" amplifier of the IC-3 integrated circuit of the oscillator circuit slowly decreases at a rate determined by the input current. This output voltage is connected through the diode D12 to the minus input of amplifier "B" of IC-3 of the oscillator circuit. The plus input to the "B" amplifier is held at a biased level determined by the setting of potentiometer RH-3. As the minus input decreases, a point is reached where it becomes less than the plus input bias and amplifier "B" switches, forcing its output to go positive. This positive going voltage is connected back to the plus input of the "B" amplifier through resistor R62 causing the "B" amplifier to switch with a substantial amount of hysteresis. The positive output of the "B" amplifier is also connected through the resistor R24 to the base of one of the transistors in IC-2, shown in FIG. 3, turning that transistor on. The voltage at the collector of the transistor collapses to essentially the negative supply voltage. The collector is connected to the clock input of the counter, IC-1, and provides one input pulse. The collector of the transistor is also connected to resistor R2 and diode D13 back to the minus input terminal of amplifier "A" of IC-3. This makes that point negative with respect to the plug input terminal and the amplifier rapidly recharges capacitor C8 until the output terminal is near the positive bus voltage. The output voltage of amplifier "A" charges capacitor C2 through resistor R45. When the voltage on capacitor C2 reaches the voltage produced on the slider of the potentiometer RH-3 by the output of amplifier "B", which is higher than the normal bias voltage at that point, amplifier "B" again switches, returning its output to near the negative supply voltage. This allows the transistor to turn off, in turn, releasing the minus terminal of the "A" amplifier allowing the integrator to again come under control of the input current. The cycle then repeats itself.

Resistors R55 and R61 provide a bias of approximately one-half of the reference bias for the oscillator 67. This provides enough margin so that if the level sensor operates, the oscillator has enough signal to function properly. Resistor R7 provides temperature stability for the transistor. Resistor R22 is a pull-up resistor for the counter clock input line, while capacitor C1 prevents high frequency switching of the transistor that could cause the IC-1 of counter 68 to malfunction.

The frequency of oscillation of this circuit is a linear function of the input current and an inverse function of the size of capacitor C8 and the change in the capacitor voltage, which is determined by the setting of the potentiometer RH-3.

The ladder circuit 68 which operates as a shaping circuit provides a signal current to the oscillator 67 that approximates the relationship of $I = IV_2^{2.3}$. Since the oscillator has an output frequency that is a linear function of the input current, the time delay then becomes $T = K/V_2^{2.3}$ where $V$ is the signal voltage and is proportional to the A.C. input current of the device.

It will be remembered from the previous discussion on the oscillator circuit that the input voltage level was determined by the bias network on the plus input of the "A" amplifier, and was not a function of the charge on the timing capacitor or of the current being supplied to the input, as described in U.S. Pat. No. 3,831,061.

The input to the oscillator 67 is biased above the 5.1 volt line by 250 millivolts by resistors R55 and R61 less the forward drop of the diode D5. The other side of the oscillator input is from the ladder circuit 68 and is 5.1 volts plus the signal less the forward drop of diode D6. Equating these two show that diodes D5, in effect, cancel the forward drop of the diodes in the ladder network, assuming, of course, that the forward drops of all the diodes are equal. In addition, the chanage in the forward drops of the ladder circuit diodes with temperature are compensated for by a similar change in the forward drop of diode D5.

As previously stated the signal from transformers 26B, 27B and 28B is fed into filter circuit. The filter circuit is one-half of the IC-5 dual operational amplifier, FIG. 3, plus the capacitor C10 and the diode D3. The purpose of this circuit is to provide a D.C. voltage that is equal to the peak of the incoming signal. This D.C. voltage is then utilized as the input for the ladder circuit 68. The input to the ladder circuit requires rectification and it is desirable to eliminate the forward voltage drop of the diode D3. To this end, the IC-5 operational amplifier is connected as a voltage follower, enclosing in its feedback loop the diode D3. The output voltage then follows the input, so that the capacitor C10 is charged to the peak of the incoming signal. The current required for charging the capacitor C10 comes from the power supply and not from the signal source, and the forward drop of the blocking diode D3 is overcome. Since the forward voltage of the diode D3 is cancelled, the variation effect due to temperature is also cancelled.

The signal ahead of diode D3 is taken for sensing the level for both the instantaneous and the short time circuits. Diode D27 and D28 operate to temperature compensate for the change in voltage drop of diode D3. Diode D4 prevents the voltage on capacitor C10 from appreciably exceeding the supply voltage during the collapse of the supply voltage.

The startup circuit utilizes the other half of the IC-5 and provides an orderly start for the circuit when power is first applied to the static trip device 10. A detailed description of the startup circuit is given in U.S. Pat. No. 3,831,061.

Until the voltage supply is high enough as compared to the 5.1 volt supply, the one-half of the operational amplifier IC-5 clamps the incoming signal line through diode D2 to near the negative supply line voltage, thus preventing the operation of any of the phase sensing circuits. With the long time pickup circuit clamped down, the counter is firmly held in the reset condition. Capacitor C3 will provide a short delay after the voltages are correct before releasing the incoming signal. This assures that counter startup is in the correct mode. Diode D18 clamps the maximum voltage on capacitor C3 to essentially the positive supply voltage.

An internal power supply for operation of the counter and for a reference voltage for the level sensing circuits is provided by Zener diodes ZD-1 and ZD-2 and the resistor R1. The bias voltage for all the level sensors is set to a desired value by potentiometer RH-2. This setting is preset.

Two identical definite delay circuits are utilized; one for the short time circuit and the other for the ground circuit. Those circuits are conventional resistor capacitor delay circuits comprised of capacitors C11 and C12 and potentiometers RH-5 and RH-6. In each case, a fixed series resistor is provided to limit the minimum time delay.

The RC charging currents are supplied directly from the output of the level sensors circuits with the potentiometers RH-5 and RH-6 providing control of the time delay.

The two delay circuits share a common, four layer diode Q4, FIG. 3. This 4 layer diode switches on when its anode voltage reaches a definite level. When Q4 turns on it operates to supply base current to the output transistor Q3 through resistor R12. The combination of the relatively large timing capacitors C11 and C12 and the series resistor R12 allows for a slow discharge of the capacitors in turn, providing enough "on" time to trip the circuit breaker 15.

Figure 4:
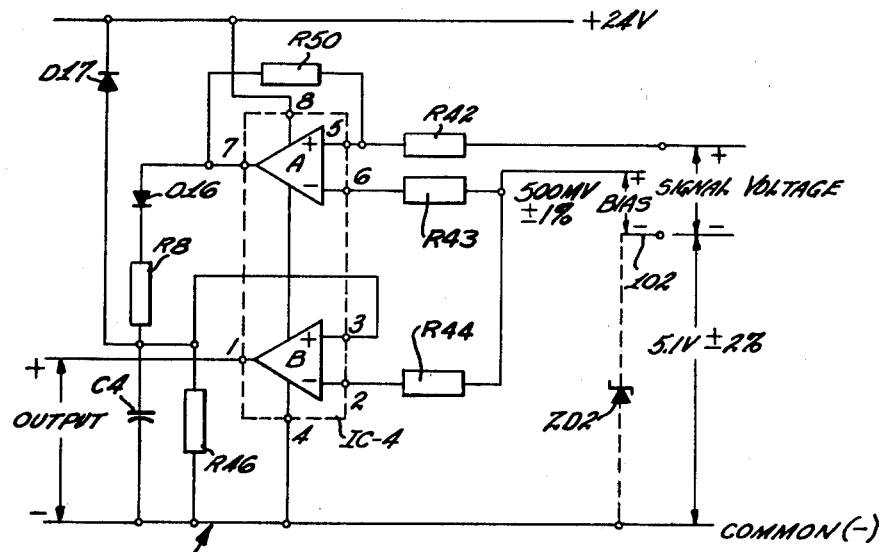
FIG. 4 is an exemplifying diagram of a level sensing circuit showing the dual operational amplifiers and other components thereof of the present invention.

The static switch circuit 42 shown in FIG. 2 is a Darlington transistor Q3, in FIG. 4, which has very high gain. The high gain minimizes the amount of drive current required to operate. The base drive for the output transistor Q3 can come from any one of 4 sources, the instantaneous circuit, the long time circuit, the short time circuit or from the ground circuit.

The embodiments of the invention in which an exclusive property or privilege is claimed are defined as follows:

1. In a signal voltage level sensing circuit;
   first means operable to sense the difference between a signal voltage and a predetermined reference voltage;
   a memory means operably connected to receive and store the output signal of said first means;
   a second means operably connected to said memory means and operable to increase the current and the voltage available from said memory means;
   means for controlling a minimum duration of input signal to which said memory means responds; and,
   means for preventing the magnitude of the voltages of said memory means from exceeding the power supply voltage when said power supply voltage is decreasing.

* * * * *